(12) United States Patent
Bour et al.

(10) Patent No.: US 7,856,040 B2
(45) Date of Patent: Dec. 21, 2010

(54) SEMICONDUCTOR LIGHT EMITTING DEVICES WITH NON-EPITAXIAL UPPER CLADDING

(75) Inventors: David P. Bour, Cupertino, CA (US); Christopher L. Chua, San Jose, CA (US); Noble M. Johnson, Menlo Park, CA (US); Zhihong Yang, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 176 days.

(21) Appl. No.: 12/237,106

(22) Filed: Sep. 24, 2008

(65) Prior Publication Data

US 2010/0074292 A1    Mar. 25, 2010

(51) Int. Cl.
*H01S 5/00* (2006.01)
(52) U.S. Cl. ................... 372/43.01; 372/45.01
(58) Field of Classification Search .............. 372/43.01, 372/45.01
See application file for complete search history.

(56) References Cited

U.S. PATENT DOCUMENTS

| | | | |
|---|---|---|---|
| 4,639,922 A * | 1/1987 | Miller | 372/19 |
| 4,796,274 A | 1/1989 | Akiba et al. | |
| 7,123,637 B2 | 10/2006 | Kneissl et al. | |
| 2005/0180475 A1 | 8/2005 | Ha et al. | |
| 2005/0279994 A1 | 12/2005 | Ueda et al. | |
| 2007/0098030 A1 * | 5/2007 | Ha et al. | 372/43.01 |

FOREIGN PATENT DOCUMENTS

| | | |
|---|---|---|
| EP | 1460741 A1 | 9/2004 |
| EP | 09170496.5 | 9/2009 |

OTHER PUBLICATIONS

Sirtori et al., Long-wavelength (lamba approx. 8-11.5 micro-m) semiconductor lasers with waveguides based on surface plasmons, Optics Ltrs., vol. 23, No. 17, pp. 1366 et seq. (Sep. 1, 1998).
Uchida et al., Recent Progress in High-Power Blue-Violet Lasers, IEEE J. Quant. Elec., vol. 9, No. 5, pp. 1252 et seq. (Sep./Oct. 2003).

* cited by examiner

*Primary Examiner*—Armando Rodriguez
(74) *Attorney, Agent, or Firm*—Jonathan A. Small

(57) ABSTRACT

The AlGaN upper cladding layer of a nitride laser diode is replaced by a non-epitaxial layer, such as metallic silver. If chosen to have a relatively low refractive index value, the mode loss from absorption in the non-epitaxial cladding layer is acceptably small. If also chosen to have a relatively high work-function, the non-epitaxial layer forms an electrical contact to the nitride semiconductors. An indium-tin-oxide layer may also be employed with the non-epitaxial cladding layer.

20 Claims, 17 Drawing Sheets

SEMICONDUCTOR LIGHT EMITTING DEVICES WITH NON-EPITAXIAL UPPER CLADDING

STATEMENT REGARDING FEDERALLY SPONSORED RESEARCH AND DEVELOPMENT

This invention was made with Government support under W911NF-08-C-0003 awarded by DARPA. Therefore, the Government has certain rights in this invention.

BACKGROUND

The present disclosure is related to semiconductor light emitting devices, and more particularly to structures with an alternative to traditional cladding layers, and method of producing same.

Semiconductor laser diodes (LDs) emitting in the range of 500 nm, also known as green-wavelength LDs are of current technical interest for a variety of applications, such as full-color visible displays (complementing the existing red and blue LDs), undersea communication, etc. Although nitride ultraviolet ($\lambda$<380 nm), near-UV ($\lambda \approx$405 nm), and violet-blue (405 nm$\leq \lambda \leq$470 nm) laser diodes have been demonstrated and produced commercially, their performance deteriorates for longer wavelengths. The sources of this reduced performance are numerous. First, longer wavelengths imply an active indium-gallium-nitride (InGaN) region of higher indium content. These alloys experience greater strain with respect to the GaN template they are typically formed upon. The higher strain may be responsible for structural defects that destroy the internal quantum efficiency; and the greater strain is also responsible for a greater piezoelectric field across the quantum wells, which also reduces the radiative efficiency by separating the injected electrons and holes. Accordingly, significant research is being undertaken relating to nonpolar or semipolar orientations of GaN.

FIG. 1 shows a generic nitride laser diode structure 10. Portion 12 of FIG. 1 shows a bandgap-energy representation, and portion 14 shows the corresponding refractive index profile associated with this structure. An optimized LD structure achieves both strong carrier confinement and optical confinement. The carrier confinement is realized by including high-bandgap alloys in the heterostructure, specifically in the cladding layers surrounding the quantum well active layer. A cladding layer having a low refractive index produces strong optical confinement.

The range of alloys to form such heterostructures is limited, however, to compositions that are not excessively strained with respect to the underlying layer (such as GaN). Thus, another challenge associated with forming a green laser diode is the difficulty of achieving adequate optical confinement. This is a consequence of both the smaller refractive-index differences (i.e., lower dispersion) of InGaN alloys at longer wavelengths, the longer wavelength itself (since the mode size scales with wavelength), and the strain limitations that may preclude using AlGaN cladding layers (which are tensile-strained and prone to cracking). Accordingly, described herein is an alternative nitride laser structure where the upper cladding layer is other than AlGaN. Investigations into alternative upper cladding layers has led to the realization that such alternative cladding layers may have applicability not only in the green wavelength devices, but in many other devices such as those emitting in the violet-blue, red, and infra-red region. This disclosure explores such structures and their applications.

SUMMARY

Accordingly, the present disclosure is directed to semiconductor light emitting devices, such as laser diodes and super-luminescent light-emitting diodes, which include a non-epitaxial upper cladding layer as compared to the traditional epitaxial upper cladding layer. According to one aspect of the present invention, the upper cladding is formed of a low electrical resistivity material, for example having an electrical resistivity of less than 1 $\Omega$-cm. Such an upper cladding layer may be comprised of a material having a low refractive index for the wavelength of emission, for example, refractive index not exceeding 0.3 for wavelengths in the range of 350-550 nm. In one embodiment, the material forming the upper cladding layer is silver (Ag), although other metals and non-metallic materials may be employed in appropriate applications.

According to one aspect of the disclosure, a semiconductor laser diode is provided which comprises a substrate; a planar crystalline semiconductor cladding layer formed over said substrate; a confinement heterostructure formed over said crystalline semiconductor cladding layer; an active region formed within said confinement heterostructure; and a planar non-epitaxial cladding layer formed over said confinement heterostructure, said non-epitaxial cladding layer having an electrical resistivity less than 1 ohm-cm; whereby, said crystalline semiconductor cladding layer and non-epitaxial cladding layer together form a waveguide that guides light in the plane of said cladding layers. The confinement heterostructure may, for example, be comprised of bulk indium gallium nitride (InGaN) or an InGaN short-period superlattice.

According to another embodiment of the present invention, the upper cladding layer may also serve as the upper p-contact for the device, eliminating the need to form a separate, additional contact layer. Additional materials such as gold (Au) can be deposited above the upper cladding layer for improved environmental protection or for wirebonding or soldering.

According to yet another embodiment of the present invention, an optically transparent conductive material such as indium tin oxide (ITO) may be provided between said confinement heterostructure and said non-epitaxial cladding layer as a phase matching layer to improve optical confinement.

According to still another embodiment of the present invention, the upper cladding layer may be formed as a stripe to provide an index-guided structure, or as a periodic grating comprising discontinuous lateral waveguide elements to form either a lateral ridge waveguide or lateral gain guide structure.

The problem of optical confinement in longer wavelength devices is addressed by the structures described above and herein. Outside of such longer wavelength devices, the alternative upper cladding structure also provides a combined cladding and contact structure, simplifying device manufacturing.

While a conventional laser diode heterostructure contains both lower (e.g., n-type) and upper (e.g., p-type) epitaxial cladding layers, the current invention eliminates the need for the upper epitaxial cladding layer. This addressed another problem: inclusion of an epitaxial upper cladding layer increases the material and complexity of a laser structure. Forming a device without a semiconducting p-AlGaN cladding layer simplifies the structure, and can lower both the series resistance and thermal resistivity, and inhibit cracking.

Furthermore, the formation of additional materials over the active region has, in many applications, required relatively high temperature deposition processes. These high temperature processes have been found to degrade the active layer.

The present invention addresses this problem by requiring only minimal additional material over the active region. The InGaN QW quality may be preserved against degradation associated with the time/temperature exposure associated with growth of a thick p-AlGaN cladding layer. This benefit is especially significant for high-indium content structures, due to the inherent thermal instability of InGaN.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We begin with consideration of longer wavelength devices (by which we mean devices which emit at 480 nm or longer). It will be understood, however, that the present invention is not limited to such longer wavelength devices. Also, we use a laser diode as an exemplary structure in the description below, however it will be understood that the present disclosure applies to a variety of light emitting devices, and is not limited to any one structural component. As described above, it is difficult to achieve sufficient transverse optical confinement in blue-green wavelength nitride-based light emitting devices such as laser diodes. This challenge arises from the relatively weak index differences among the alloys comprising the heterostructure, combined with lattice-strain limitations. For example, due to these strain and index limitations, the typical AlGaN cladding layers used to provide confinement in conventional 405 nm laser diodes do not provide sufficient confinement to reach the green wavelengths.

To address this limitation, we have investigated alternative structures, including alternative cladding layer compositions, and have discovered that certain materials provide a workable alternative to known upper confinement layer structures. In general, such materials must be low-loss at the wavelength of emission of the laser device, and have relatively low electrical resistivity, for example, below 1 ohm-centimeter ($\Omega$-cm). Accordingly, the properties of silver (Ag) metal make it a good candidate for a cladding layer material. Disclose herein is a Ag-clad waveguide structure viable for nitride (longer wavelength) LDs. However, it will be understood that Ag is but one example of the family of materials suitable for an alternative waveguide cladding layer according to the present invention.

Figure 1:
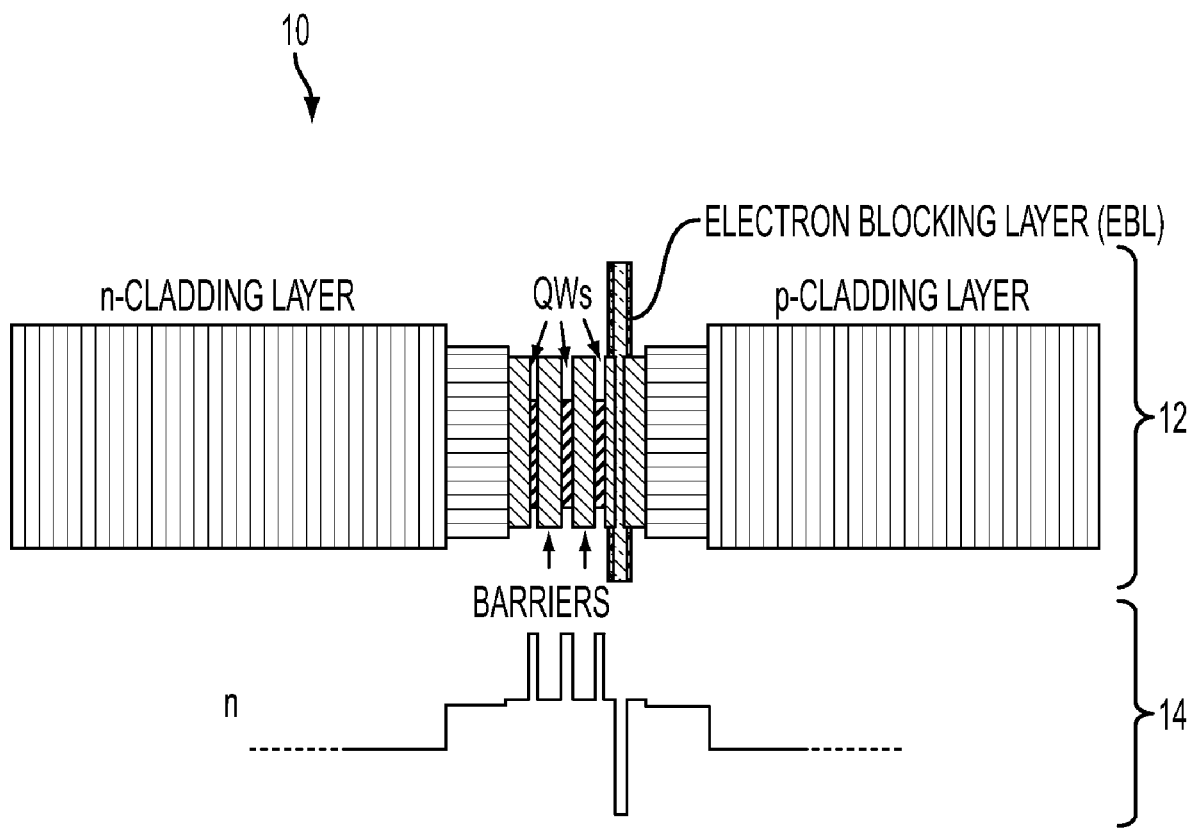
FIG. 1 is an illustration of a prior art nitride laser diode structure, showing a bandgap-energy representation, and a corresponding refractive index profile.
Figure 2A:
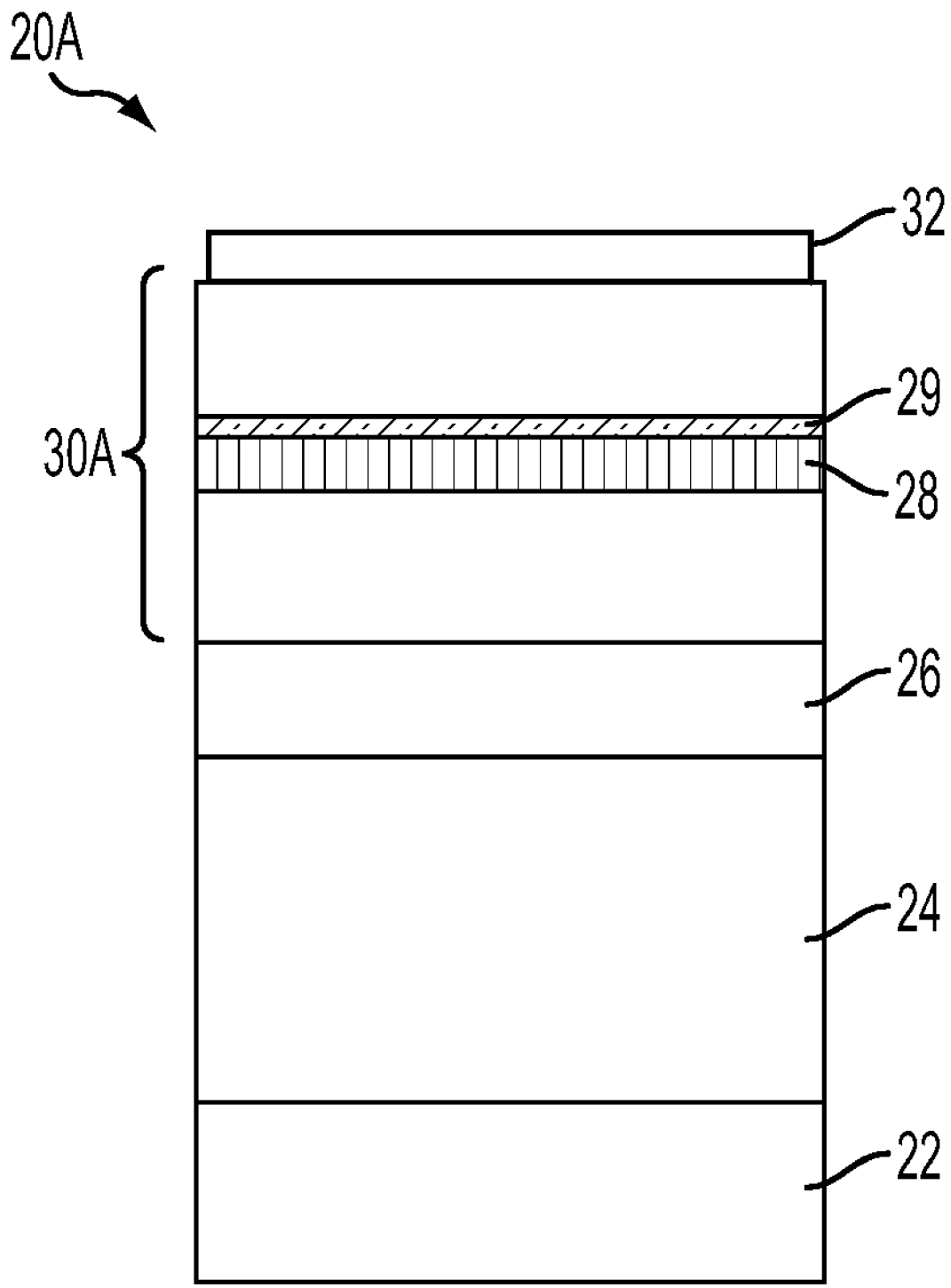
FIGS. 2A and 2B are cross-section cut-away views of a semiconductor light emitting device according to first and second embodiments of the present invention, respectively.
Figure 2B:
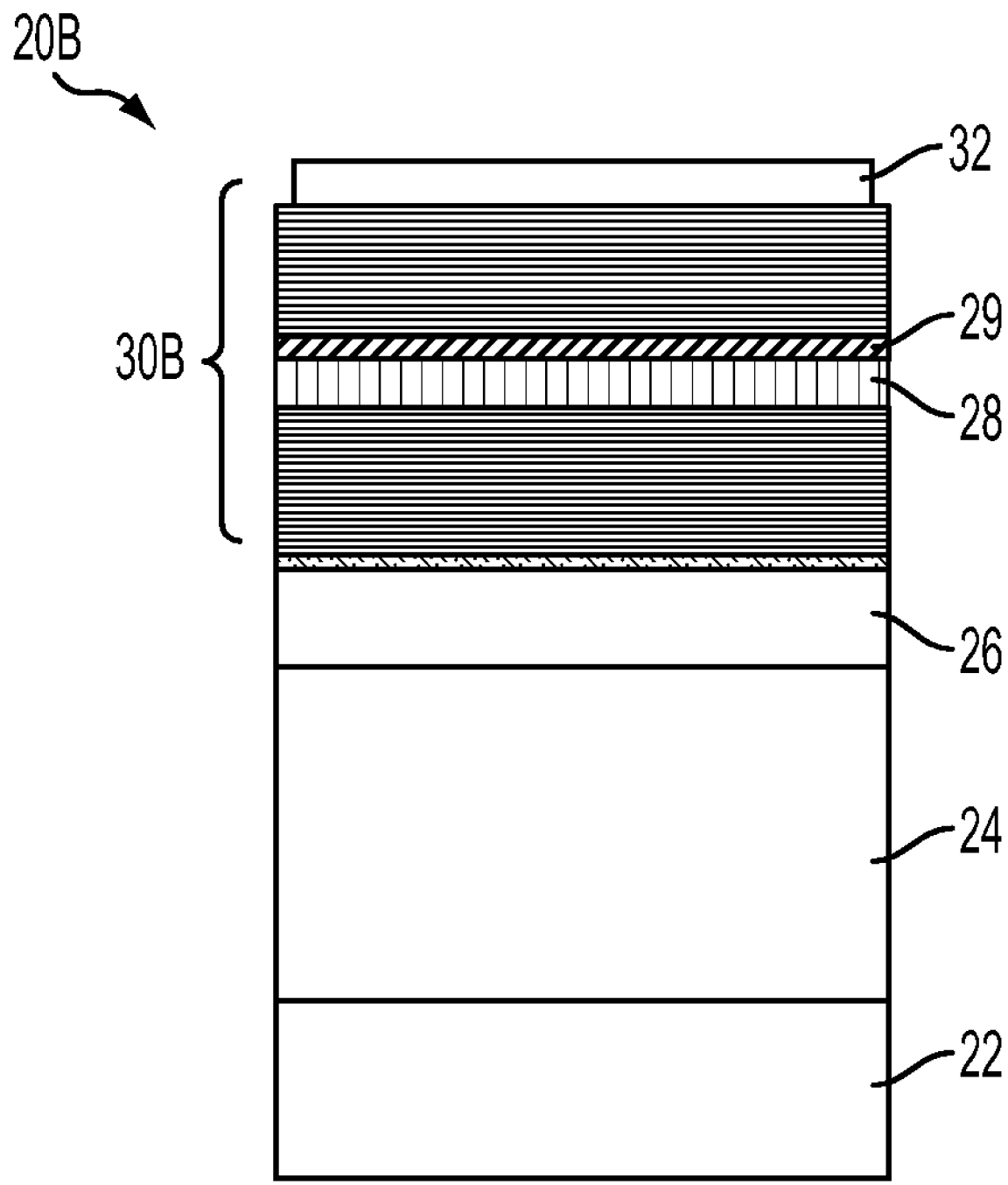

With reference to FIGS. 2A and 2B, there is shown therein a schematic illustration of structures 20A and 20B according to the present disclosure. Structure 20A comprises a standard sapphire ($Al_2O_3$) or GaN substrate 22, on which is formed a GaN template layer 24. The active region 28 comprises a relatively conventional InGaN multiple-quantum-well (MQW) adjusted for 500 nm emission, for example with In composition in the range of 25-30%. MQW 28 is embedded in an InGaN separate confinement heterostructure (SCH) 30. InGaN SCH may be bulk material 30A, shown in FIG. 2A or, alternatively, may be formed wholly or partially from an InGaN short-period superlattice (SPSL) 30B, shown in FIG. 2B. In the latter case, the SPSL functions to suppress threading dislocations which might otherwise form and thread upward from the strained InGaN/AlGaN interface.

According to one embodiment of the present invention, the structure is provided with a transverse waveguide which is asymmetric across the active region. As will be discussed in detail below, above InGaN SCH 30A, B, an alternative cladding layer 32 is provided. Cladding layer 32 has a number of unique criteria. First, is it highly optically reflective at the wavelength of operation of the active layer. This may be quantified, for example, by examining the complex index of refraction of the selected material. Second, the material is relatively highly conductive. This may be quantified, for example, by examining the bulk resistivity of the selected material. While the actual material selected for cladding layer 32 will vary from application to application, one example discussed further below which meets these criteria is metallic silver.

The n-side of the laser structure may optionally include an n-AlGaN layer 26 to serve as a cladding layer. The AlGaN layer is optional due to the thick GaN substrate/template which itself may serve as a lower cladding layer. Whether the additional n-AlGaN layer 26 is provided or not, it will now be appreciated that the lower and upper cladding layers are of different materials, and very likely of different thicknesses, even though the cladding pair provide waveguiding in the plane of the layers (i.e., transverse waveguiding). Accordingly, we refer to this system as an asymmetric transverse waveguide.

Focusing now on cladding layer 32, the high reflectivity is required to minimize optical loss. Accordingly, the complex index of refraction of the material is an important measure. In general, a complex index of refraction is defined as:

$$\tilde{n} = n + i\kappa$$

where n is the real portion or refractive index, and $\kappa$ is the imaginary portion or extinction coefficient, which indicates the amount of absorption loss when the electromagnetic wave propagates through the material. An examination of the complex index of refraction will provide information about the reflectivity of the selected material. The reflectivity of light arriving at normal incident to the cladding layer is given by $$R = \frac{(n - n_i)^2 + (\kappa - \kappa_i)^2}{(n + n_i)^2 + (\kappa + \kappa_i)^2}$$

where $n_i$ and $\kappa_i$ are the refractive index and the extinction coefficient, respectively, of the material from where light is incident from.

In a waveguide structure, the cladding reflectivity seen by the guided wave depends on the "direction vector" of the guided wave. Nevertheless, the reflectivity at normal incidence, R, is a simple and convenient measure that can be used when selecting materials for the cladding layer. Once chosen, the actual performance of the selected material as a cladding layer should then be evaluated by numerical simulation of the waveguide.

A desirable cladding material should exhibit a high reflectivity. If this condition is satisfied, the optical mode experiences only a very small penetration into the material, and low modal loss can be achieved even if the cladding material has a high extinction coefficient.

A candidate cladding material that has a very small real component of the complex index will have a large refractive index mismatch with respect to the semiconductor. Since the mismatch appears on the numerator of the expression for R, such a material would be a promising candidate for providing the desired high reflectivity because a high normal incidence reflectivity correlates with a high guided mode reflectivity. Silver, for example, would be a promising candidate for the cladding material because it has a low refractive index.

Cladding layer 32 also serves as an ohmic contact, and therefore relatively low bulk resistance is required. Certain high work-function metals are one category of materials with desirable low electrical resistance. However, most high-work-function metals (e.g., Pd, Pt, Ni) which are available for forming ohmic contact to p-type nitrides do not satisfy this low-index criteria. Hence, they are very optically lossy, so that for conventional nitride LD structures a sufficiently thick p-cladding layer must be grown over the active region in order to contain the evanescent tail of the mode and thereby suppress its overlap with the absorptive metal. Silver is an exception, as its real index n is low throughout the entire visible spectrum. Moreover, it is a high-work-function material which may form a low-resistance ohmic contact to p-type nitride semiconductors. Consequently, silver is one material satisfying the low optical loss, high conductivity requirements so as to be substitute for the p-type semiconductor cladding layer. Indeed, such a material may also function as the upper p-contact for the device.

Figure 3:
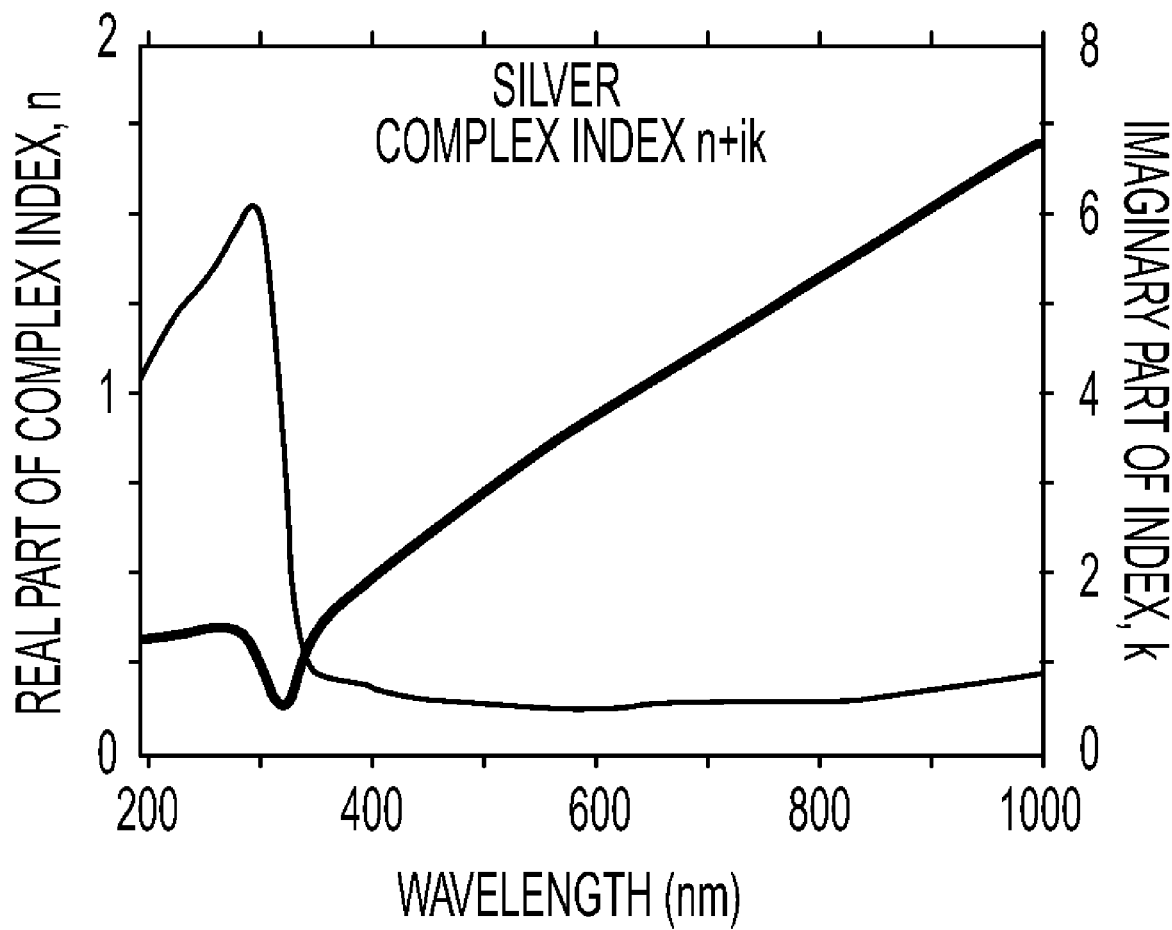
FIG. 3 is a plot of the complex index, $\tilde{n}=n+i\kappa$, values for silver.

FIG. 3 is a plot of the complex index, $\tilde{n}$, values for silver. The real component, n, of silver's complex index is very small (below about 0.3 for wavelengths above 350 nm, particularly in the range of about 480-550 nm), extending through the entire visible spectrum. Using these index values, a Ag-clad LD structure of the composition shown in FIG. 2, was simulated. The simulation was for a device operating at a wavelength of 500 nm.

Table 1 tabulates the normal incident reflectivity of silver and nickel for light propagating from a GaN layer. Note that Ag is a much better reflector than Ni for wavelengths ranging from 365 nm to 530 nm. Therefore, Ag is a good choice for a cladding material in the GaN system. Other cladding material choices may be suitable for other wavelengths in other material systems, such as the red or near infra-red wavelengths in the GaAs or InP systems.

TABLE 1

| wavelength (um) | Ag (n) | Ag (k) | Ni (n) | Ni (k) | GaN (n) | GaN (k) | $R_{Ag}$ | $R_{Ni}$ |
| --- | --- | --- | --- | --- | --- | --- | --- | --- |
| 0.3647 | 0.186 | 1.61 | 1.61 | 2.23 | 2.71 | 1.41E−02 | 0.8087 | 0.2583 |
| 0.3757 | 0.2 | 1.67 | 1.61 | 2.26 | 2.65 | 3.34E−06 | 0.8057 | 0.2661 |
| 0.3875 | 0.192 | 1.81 | 1.61 | 2.3 | 2.60 | 1.27E−09 | 0.8197 | 0.2724 |
| 0.4 | 0.173 | 1.95 | 1.61 | 2.36 | 2.57 | 2.02E−13 | 0.8429 | 0.2818 |
| 0.4133 | 0.173 | 2.11 | 1.61 | 2.44 | 2.54 | 5.56E−17 | 0.8512 | 0.2943 |
| 0.4275 | 0.16 | 2.26 | 1.62 | 2.52 | 2.51 | 1.43E−20 | 0.8687 | 0.3051 |
| 0.4428 | 0.157 | 2.4 | 1.62 | 2.61 | 2.49 | 3.64E−24 | 0.8775 | 0.3194 |
| 0.4592 | 0.144 | 2.56 | 1.64 | 2.71 | 2.47 | 5.92E−28 | 0.8937 | 0.3316 |
| 0.4769 | 0.132 | 2.72 | 1.66 | 2.81 | 2.45 | 1.14E−31 | 0.9080 | 0.3437 |
| 0.4959 | 0.13 | 2.88 | 1.67 | 2.93 | 2.43 | 2.67E−35 | 0.9149 | 0.3605 |

TABLE 1-continued

| wavelength (um) | Ag (n) | Ag (k) | Ni (n) | Ni (k) | GaN (n) | GaN (k) | $R_{Ag}$ | $R_{Ni}$ |
|---|---|---|---|---|---|---|---|---|
| 0.5166 | 0.13 | 3.07 | 1.71 | 3.06 | 2.42 | 5.32E−39 | 0.9210 | 0.3734 |
| 0.5391 | 0.129 | 3.25 | 1.75 | 3.19 | 2.41 | 0.00E+00 | 0.9269 | 0.3862 |

Figure 4:
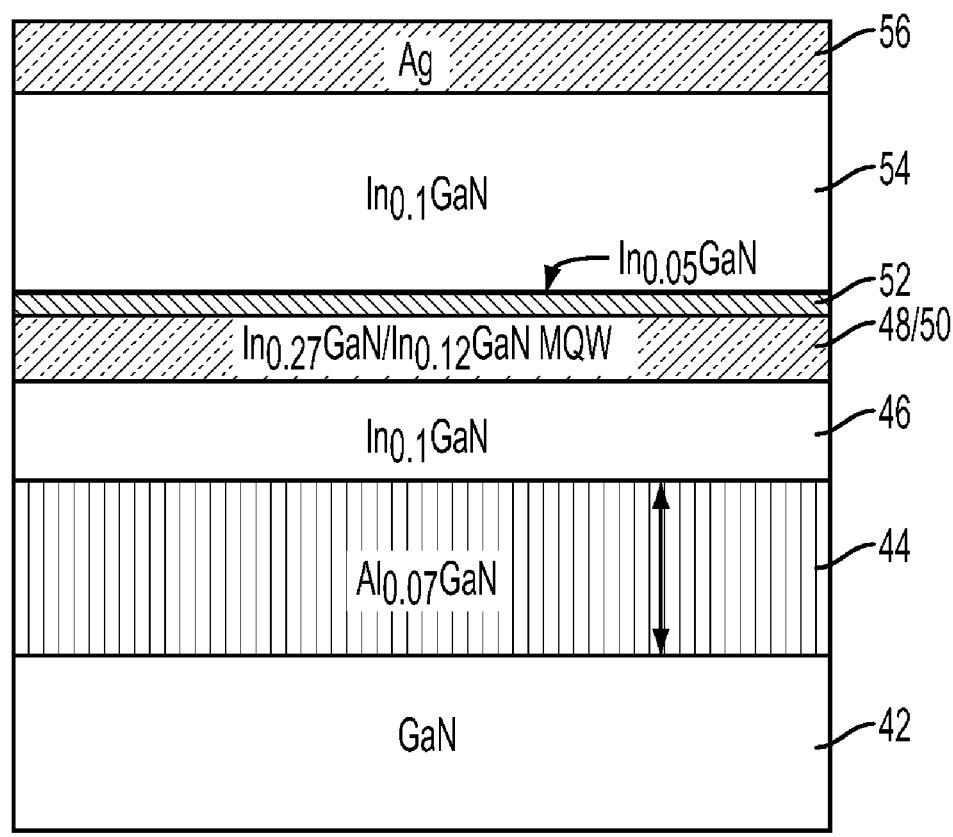
FIG. 4 is a cross-section cut-away view of a semiconductor light emitting device illustrating the constitution of the active region structure according to an embodiment of the present invention.

The constitution of the structure 40 and corresponding index values of the respective layers thereof are illustrated in FIG. 4, and described in Table 2, below.

TABLE 2

| Layer composition | Index, n |
|---|---|
| Ag (56) | 0.13 + 2.95i |
| $In_{0.10}Ga_{0.90}N$ p-SCH (54) | 2.456 |
| (15 nm) $In_{0.05}Ga_{0.95}N$ p-type EBL (52) | 2.44 (15 nm) |
| (4 × 3) nm $In_{0.27}Ga_{0.73}N$ QWs (50) | 2.54 (3 nm) |
| (5 × 7 nm) $In_{0.12}Ga_{0.88}N$ barrier (48) | 2.463 (7 nm) |
| $In_{0.10}Ga_{0.90}N$ n-SCH (46) | 2.456 |
| $Al_{0.07}Ga_{0.93}N$ clad (44) | 2.41 |
| GaN (42) | 2.426 | evaluated at wavelength λ = 500 nm

Transverse guided-mode simulations were performed for this silver-clad structure. For the fundamental TE mode, the optical confinement factor (Γ) and the mode loss (α) due to the silver cladding/p-contact were determined. The tradeoff between Γ and α was examined, and the structural parameters were adjusted to optimize this tradeoff. Specifically, the $In_{0.1}GaN$ lower- and upper-SCH layers 46, 54 were adjusted to maximize the optical confinement factor value, and the loss and F values were evaluated for several different $Al_{0.07}GaN$ lower cladding layer 44 thicknesses. All simulations assumed a wavelength of 500 nm. It should be appreciated that, the results of this investigation also translate to any wavelength for which silver is a strong reflector, i.e., λ>350 nm, as shown by its dispersion characteristic in FIG. 3.

Figure 5:
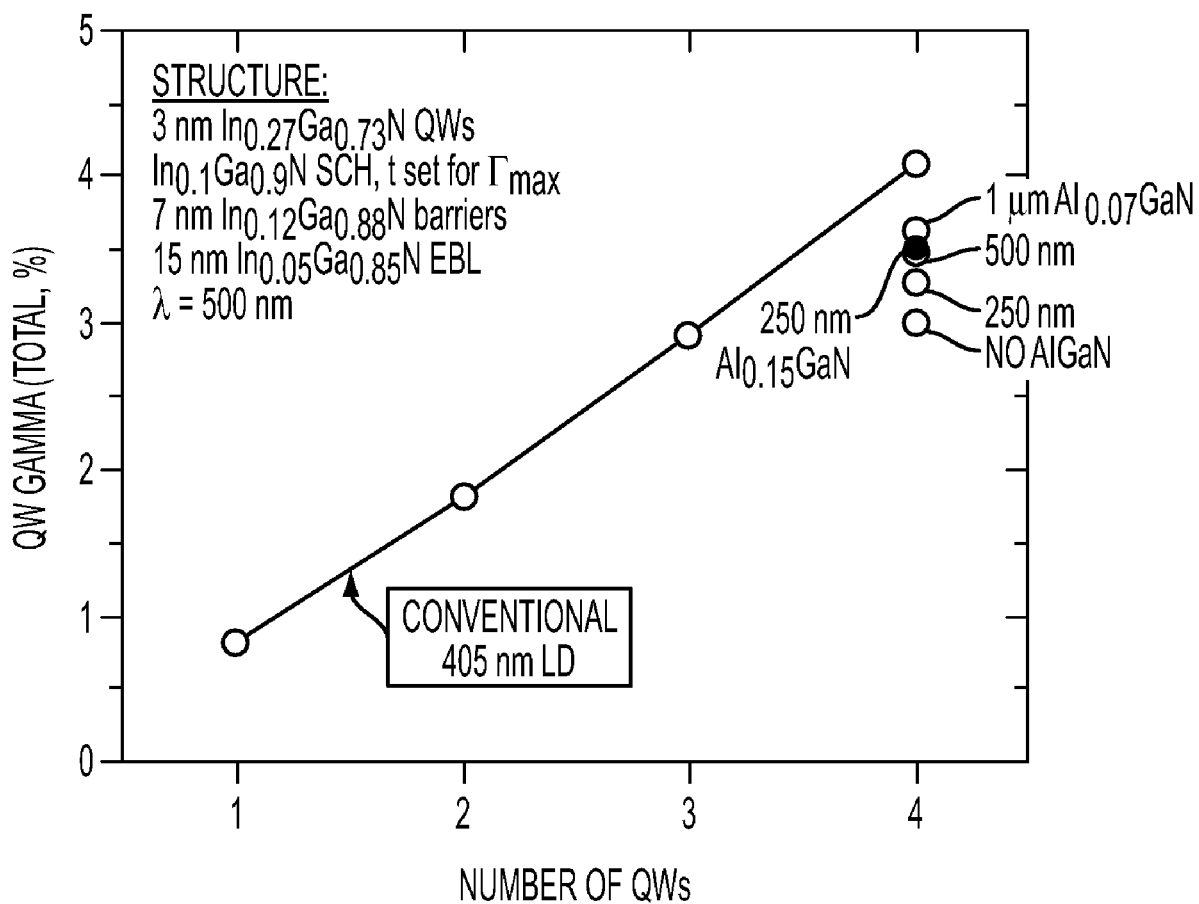
FIG. 5 is a graph of the aggregate confinement factor ($\Gamma$) value for a conventional 405 nm laser, as a function of the number of 3 nm InGaN QWs, for a 4QW, 500 nm LD with silver cladding having an AlGaN lower cladding layer thicknesses ($Al_{0.07}GaN$) of 0, 250 nm, 500 nm, and 1000 nm thickness, and for 250 nm $Al_{0.15}GaN$.
Figure 6:
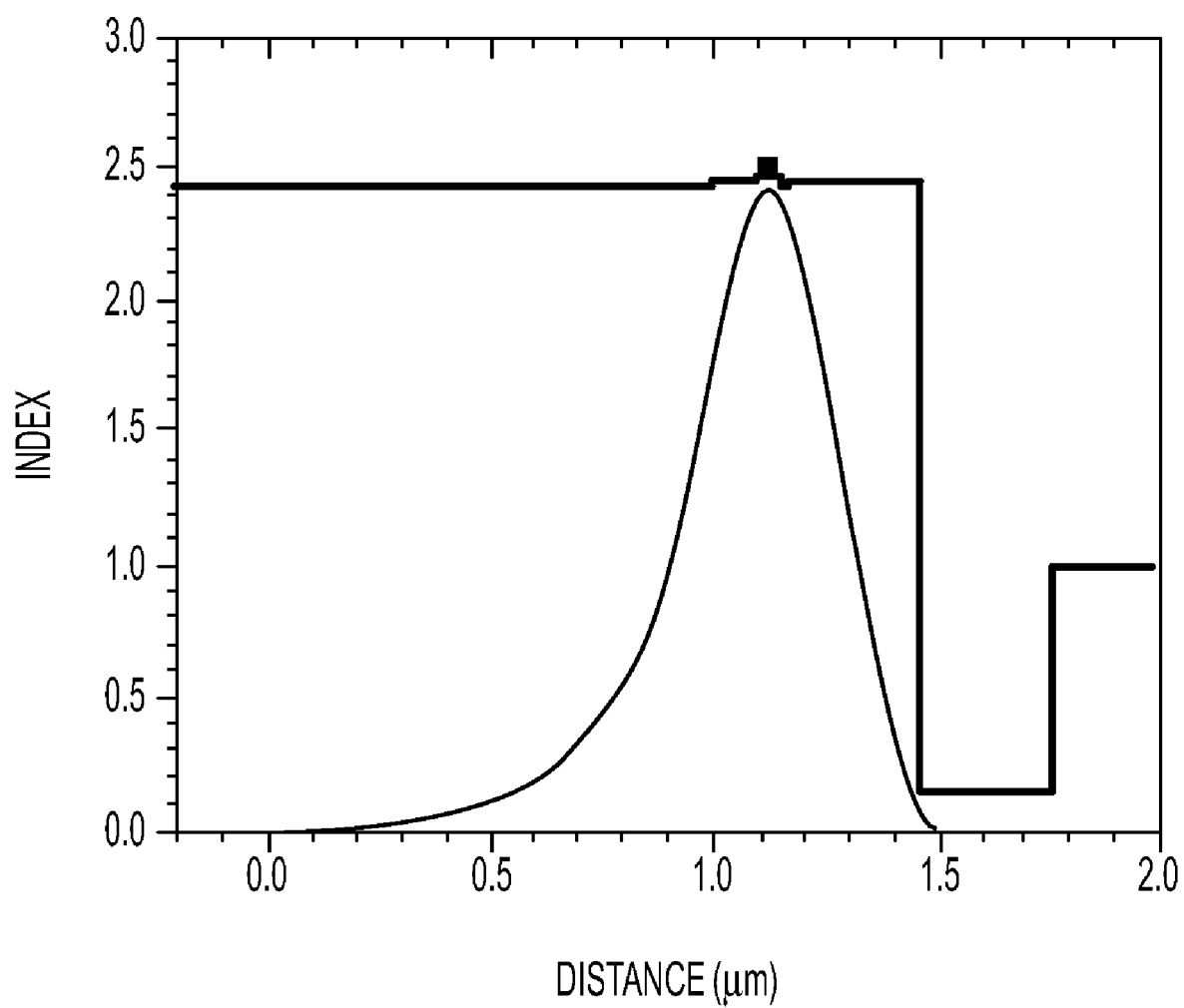
FIG. 6 is graph of the transverse near-field mode intensity profile is for the case of no AlGaN lower cladding layer (i.e., the lower cladding is entirely GaN).

FIG. 5 shows the aggregate Γ value, $Γ_{total}$, for a conventional 405 nm laser, as a function of the number of 3 nm InGaN QWs. For a 4-QW structure Γ is ~4%, or 1% per QW. For comparison, the $Γ_{total}$ values for the 4QW, 500 nm LD with silver cladding are also represented. Five points are shown, corresponding to the cases of different $Al_{0.07}GaN$ lower cladding layer thicknesses, including 0 nm (i.e., no AlGaN lower cladding layer), 250 nm, 500 nm, and 1000 nm thickness. Also shown are the data for a 250 nm thick lower cladding layer of $Al_{0.15}GaN$. For each of these two compositions, the largest thickness represents the approximate strain limit for a film grown epitaxially on a GaN template. Likewise for each case, the SCH layer thicknesses are adjusted to give the maximum $Γ_{total}$ value. The optimum values for the SCH thickness will ultimately depend on the tradeoffs between $Γ_{total}$, $α_{metal}$, and the gain-current characteristic of the QW gain medium. An example of the transverse near-field mode intensity profile is shown in FIG. 6 for the case of no AlGaN lower cladding layer (i.e., the lower cladding is entirely GaN).

Figure 7:
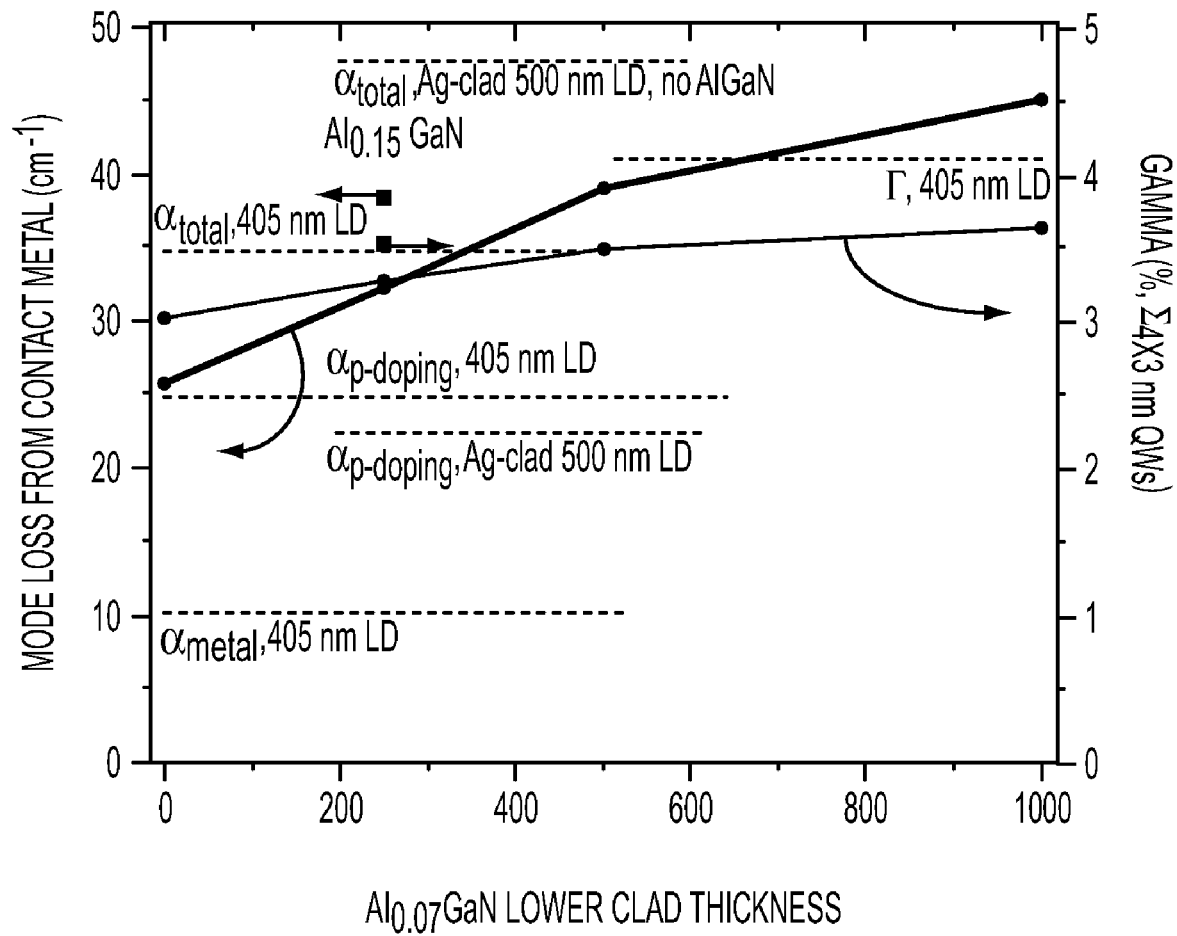
FIG. 7 is a graph of the aggregate confinement factor ($\Gamma$) value and the mode loss due to the metal cladding, along with the values for a conventional 405 nm 4×3 nm $In_{0.1}GaN$ QW LD.

A summary of $Γ_{total}$ and the mode loss due to the metal cladding are indicated in Table 3, below, along with the $In_{0.1}GaN$ SCH thicknesses that maximize $Γ_{total}$. Similarly, these $Γ_{total}$ and $α_{metal}$ values are plotted in FIG. 7. And for comparison, the values for a conventional 405 nm 4×3 nm $In_{0.1}GaN$ QW LD are also indicated (dashed lines in FIG. 7). The Ag-clad 500 nm LD structure has somewhat lower $Γ_{total}$, and significantly greater loss, attributed to the metal. Including an AlGaN lower cladding layer contributes greater confinement for higher Γ, but it also causes a significant increase in loss due to absorption by the silver-metal cladding layer on the opposite side of the waveguide. The lowest $α_{metal}$ loss is achieved for the AlGaN-free structure. While the loss is higher than that of a conventional 405 nm laser, the total loss for the Ag-clad structure compares more favorably with that of a conventional 405 nm LD. This is so because of the additional loss associated with p-type doped layers, with an inferred local loss of ~60 cm$^{-1}$ for the p-type cladding layers (presumably due to scattering by $MgN_x$ precipitates, inversion-domain boundaries, defect-level absorption, or intervalence band absorption). It is expected that the loss due to the p-type material ($α_{p-doping}$) will be lower for the 500 nm structure for these reasons:

1. Due to the strong asymmetry inherent in the Ag-clad structure and associated mode (see FIG. 6), there is less mode overlap with the p-type layers in the Ag-clad structure; and
2. The p-type layers in the Ag-clad structure are InGaN rather than AlGaN, therefore the acceptor activation energy is lower and less doping is required to achieve a given hole concentration.

TABLE 3

| Lower Clad | | $SCH_{optimum}$ (n, p) | $Γ_{total}$ | $α_{metal}$ |
|---|---|---|---|---|
| $Al_{0.07}GaN$ | 1000 nm | 97, 241 nm | 3.6% | 45 cm$^{-1}$ |
| | 500 nm | 117, 256 nm | 3.5% | 39 cm$^{-1}$ |
| | 250 nm | 134, 276 nm | 3.3% | 32 cm$^{-1}$ |
| | 0 nm (GaN) | 110, 299 nm | 3.0% | 26 cm$^{-1}$ |
| $Al_{0.15}GaN$ | 250 nm | 145, 263 nm | 3.5% | 38 cm$^{-1}$ |
| Conventional 405 nm 4QW LD | | | 4.1% | 10 cm$^{-1}$ |

We have also attempted to quantify and compare the mode loss corresponding to the p-doped layers of the conventional and silver-cladded structures. By assuming that the p-type layers have a bulk loss of 60 cm$^{-1}$, the mode loss due to p-doping is simply the spatial overlap of the normalized optical mode with this local loss in the p-doped layers. These $α_{p-doping}$ values are shown by dashed lines in FIG. 7 as 25 cm$^{-1}$ for a conventional 405 nm LD, and 21 cm$^{-1}$ for the 500 nm Ag-clad LD with GaN lower cladding, for a total mode loss ($α_{total}=α_{p-doping}+α_{metal}$) of 35 cm$^{-1}$ and 48 cm$^{-1}$, respectively (also shown by dashed lines in FIG. 7). The lower p-doping loss for the Ag-clad structure reflects its asymmetric mode shape as evidenced in FIG. 6.

These simulations serve to show that the Ag-clad structure offers acceptable $Γ_{total}$ and $α_{metal}$ values. Additional optimization of other structural parameters (SCH composition, graded compositions, doping profile, etc.) may lead to further improvement. Most importantly, this is accomplished without AlGaInN cladding layers. Thus, the Ag-clad structure is well targeted to longer wavelength devices (e.g., green LDs), particularly because excessive strain may limit the practicality of conventional structures. But again, it must be realized that the asymmetric cladding, with the upper cladding being optically reflective and electrically conductive, is also applicable at shorter wavelengths.

Figure 8:
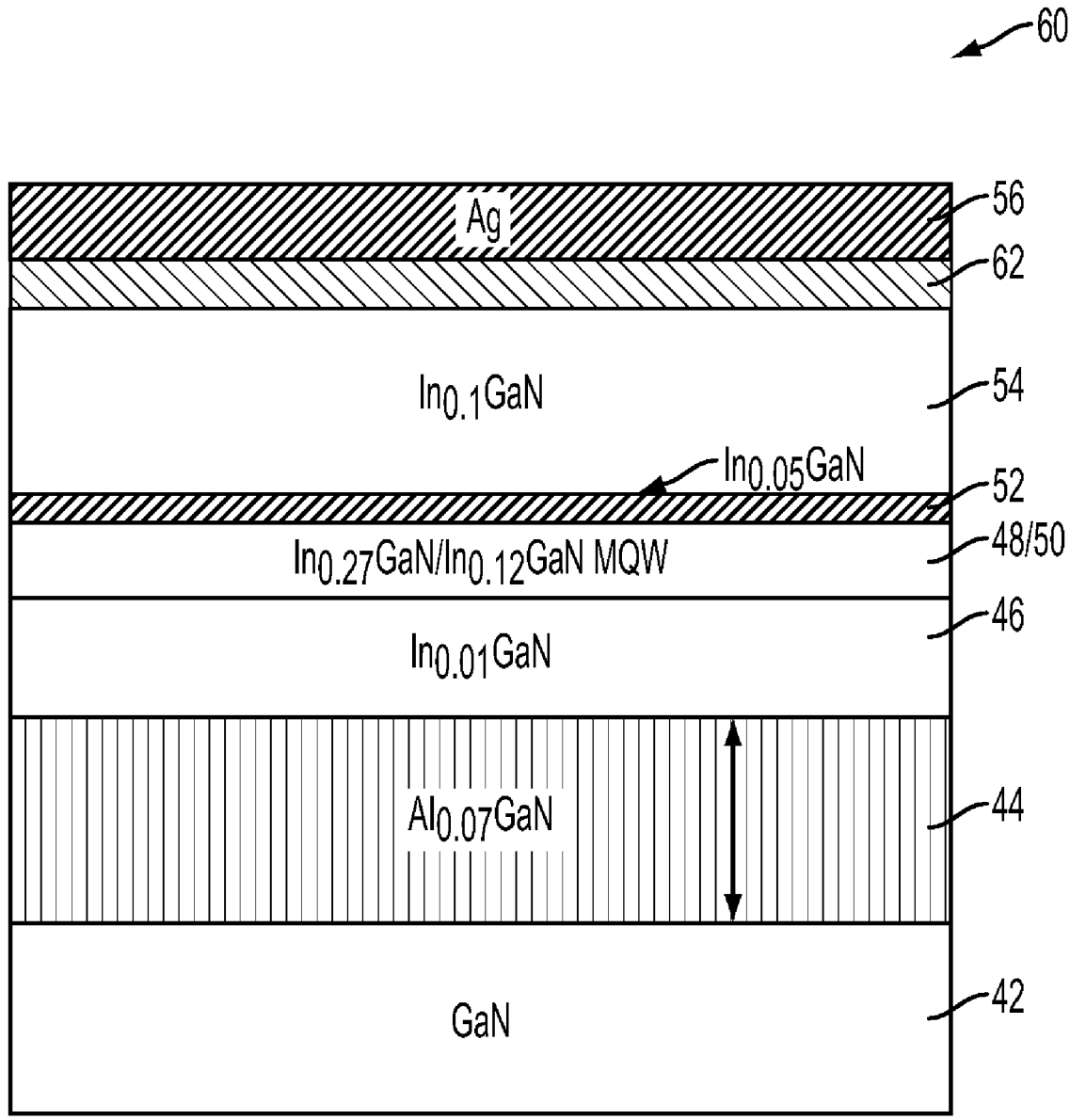
FIG. 8 is a cross-section cut-away view of a semiconductor light emitting device including a transparent conductor such as indium-tin-oxide (ITO) between the metal and the p-type semiconductor surface according to an embodiment of the present invention.

The mode loss may be further reduced by inclusion of a phase matching layer 62 between the metal and the p-type semiconductor surface. A transparent conductor such as indium-tin-oxide (ITO) could be used as the phase matching layer. Other transparent conductors are also viable, for example zinc oxide (ZnO) or indium zinc oxide (IZO). This modified structure is shown in FIG. 8 using ITO as an example. The measured dispersion characteristics of the ITO transparent electrode are shown in FIG. 9.

Figure 9:
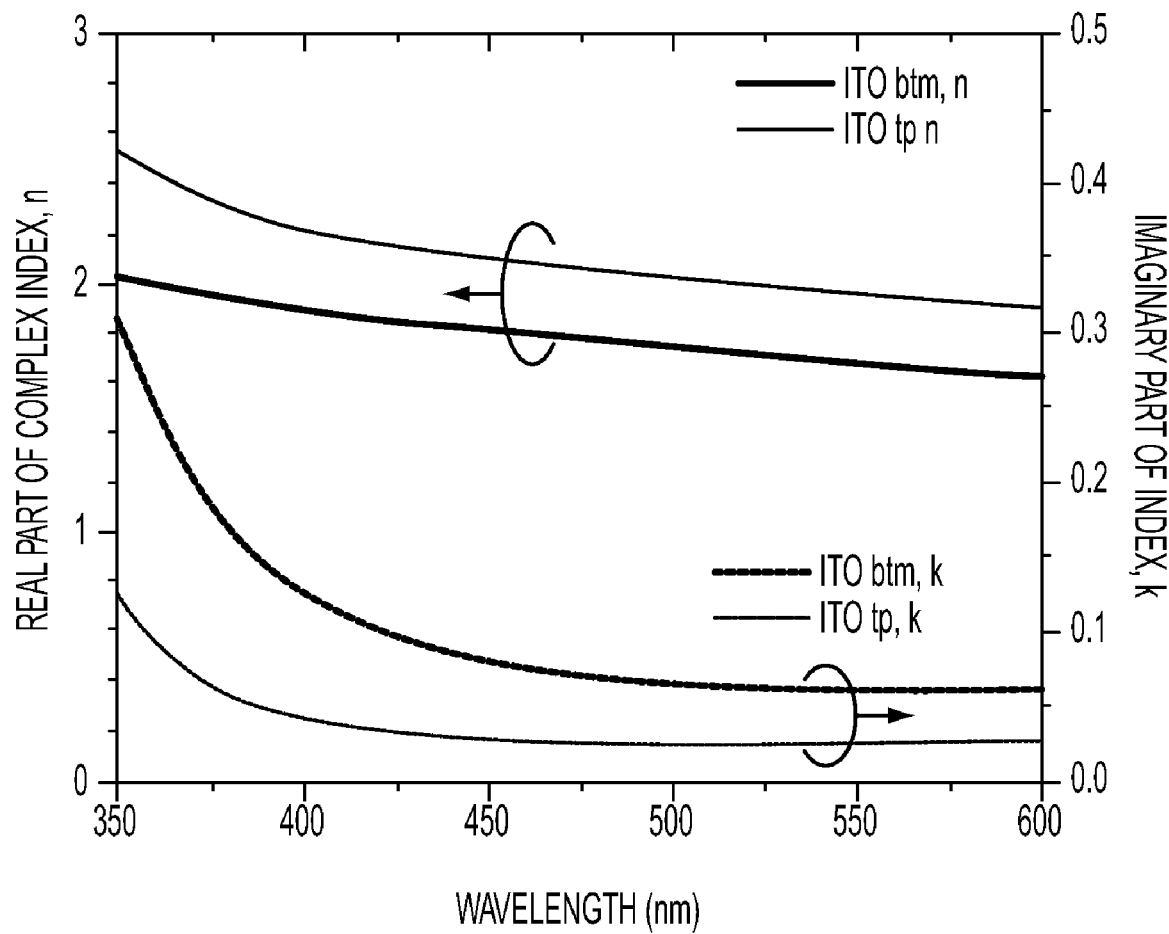
FIG. 9 is a graph illustrating measured dispersion characteristics of the structure illustrated in FIG. 8.

The dispersion characteristics in FIG. 9 represent the n (solid curves) and κ (dashed curves) values for an ITO film analyzed assuming two components: a portion near the deposition interface ("bottom", single curve), and the top of the film ("top", double curve). The real part of ITO's refractive index is about 2, or a few tenths less than that of GaN, and its imaginary component is much smaller than for a metal. Consequently, for a structure with a composite ITO+Ag cladding layer, the mode loss may be reduced compared to a metal-only cladding layer.

Furthermore, in certain applications, this structure is additionally advantageous because it separates the ohmic contact function from the waveguide cladding-layer function. These two requirements often conflict and must be traded-off against each other, i.e., it is difficult to find a metal which offers both the requisite high work function and low mode loss. For the composite ITO+Ag cladding structure, ITO serves as the ohmic contact, and the choice of overlying metal is not so limited to metals such as silver, which have a high work function. Rather, a much wider range of reflective materials becomes viable, so long as the material properties allow for a low modal absorption loss. Thus, one embodiment incorporates ITO and n- and p-SCH layers whose thicknesses and compositions are adjusted to maximize the $\Gamma_{total}$ value and/or minimize the mode loss α. A comparison of these values for Ag-clad and ITO+Ag-clad lasers, at a wavelength of 500 nm (for the structure indicated in FIG. 4), is shown in Table 4, below (assuming ITO index corresponding to the "bottom" material). By inserting a 50 nm layer of ITO between the p-InGaN and silver, the mode loss can be significantly reduced from 45 cm$^{-1}$ to 31 cm$^{-1}$, without compromising the optical overlap Γ.

TABLE 4

|  | Ag | Ag + ITO |
| --- | --- | --- |
| n-SCH | 100 nm | 100 nm |
| P-SCH | 239 nm | 218 nm |
| ITO | — | 50 nm |
| $\Gamma_{total}$ 4QW (%) | 3.6 nm | 3.6 nm |
| α (cm$^{-3}$) | 45 nm | 31 nm |

Figure 10:
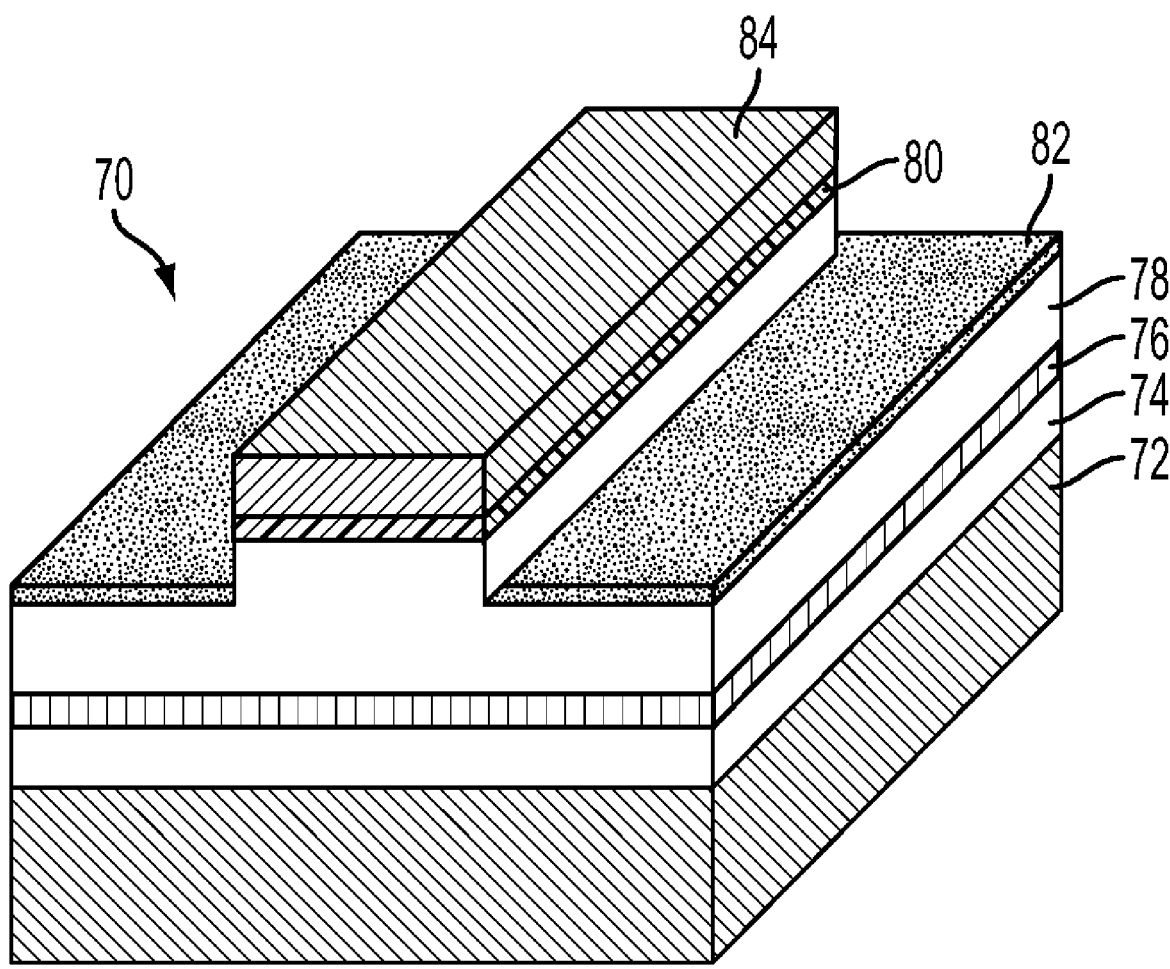
FIG. 10 is perspective view of a semiconductor light emitting device formed to have a ridge waveguide comprised of a silver and ITO cladding structure according to an embodiment of the present invention.

A structure 70 incorporating ridge waveguides may also be constructed from this silver or Ag+ITO clad structure, as shown in FIG. 10. Over a substrate (not shown), an n-AlGaN lower cladding layer 72 is formed. An active region 76 of the type previously described is formed between lower n-InGaN SCH 74 and upper p-InGaN 78. A region of ITO is then deposited and patterned to form a ridge structure 80, then a passivation layer 82 such as of SiNx is deposited. Finally, an upper cladding layer 84 such as silver metal is deposited.

A positive lateral index guide is formed by etching away a portion of the upper p-SCH outside the laser stripe. For example, by etching away 50 nm of the p-SCH from the optimized Ag+ITO-clad 500 nm structure described in Table 4, above (i.e., reducing its thickness from 218 nm to 168 nm), the mode effective index is depressed by approximately 0.005. This is a reasonable value for forming a single-mode waveguide, and typical of conventional ridge waveguides. Accordingly, the ridge width and etch-depth (which determines the lateral index step) should be optimized in the normal manner, to give the following performance characteristics:
 1. Low threshold current;
 2. Low fundamental mode loss; and
 3. Strong mode discrimination (e.g., high loss and/or lower gain for high-order modes), for stable single-mode operation.

Figure 11A:
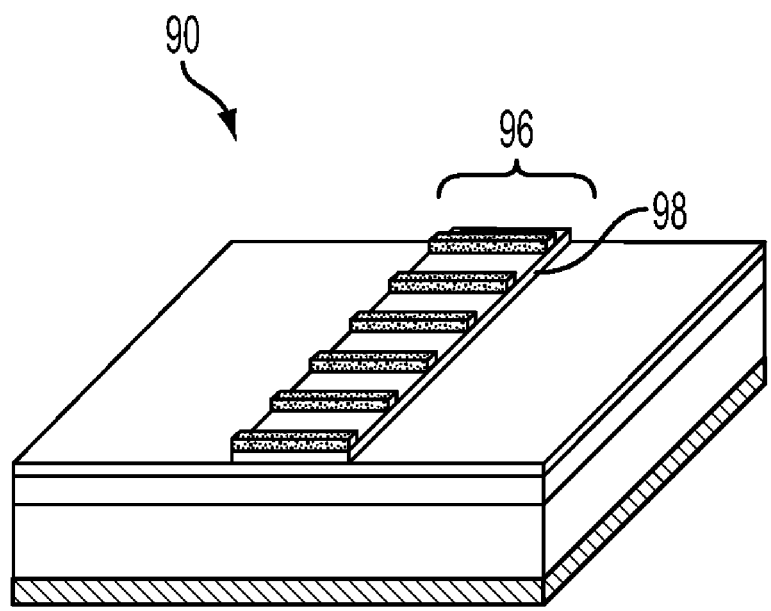
FIGS. 11A and 11B are perspective view and cut-away side views, respectively, of a semiconductor light emitting device having a metal cladding layer comprised of a grating of periodic stripes of silver metal forming a lateral ridge waveguide according to an embodiment of the present invention.
Figure 11B:
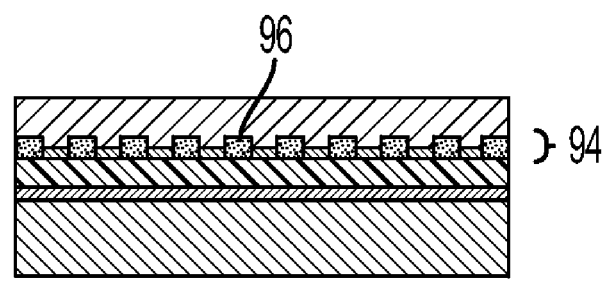
Figure 12:
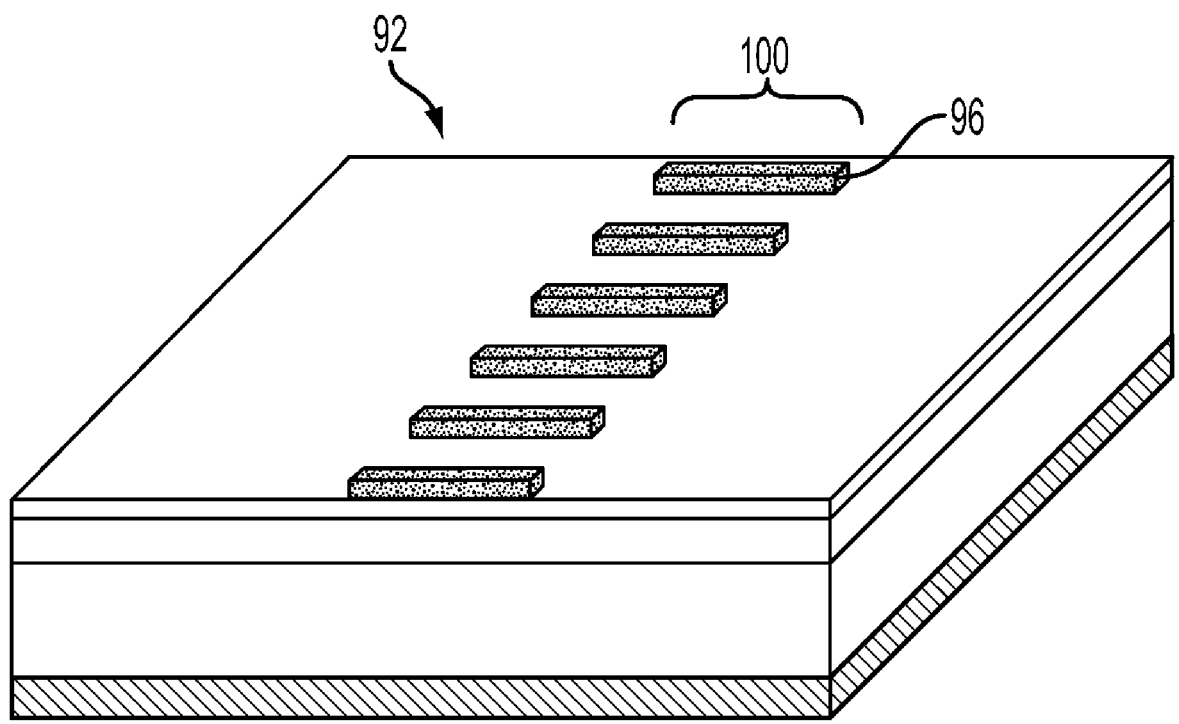
FIG. 12 is perspective view and cut-away side view of a semiconductor light emitting device having a metal cladding layer comprised of a grating of periodic stripes of silver metal forming a gain-guided waveguide according to an embodiment of the present invention.

In additional embodiments 90, 92 of the present invention, the Ag-clad structure forms a distributed feedback (DFB) or distributed Bragg reflector (DBR) laser. With reference to FIGS. 11 and 12, a metal cladding layer 94 is formed as a grating of periodic stripes 96 of silver metal, or Ag+ITO. This structure may be formed over a lateral ridge waveguide 98, as shown in FIGS. 11A and 11B, or the current injection may define a gain-guided stripe 100 as shown in FIG. 12. In comparison to a more traditional etched (surface corrugation) grating, the metal grating provides complex coupling (i.e., periodic index variation accompanied by a gain/loss modulation) that favors single-mode operation.

Figure 13:
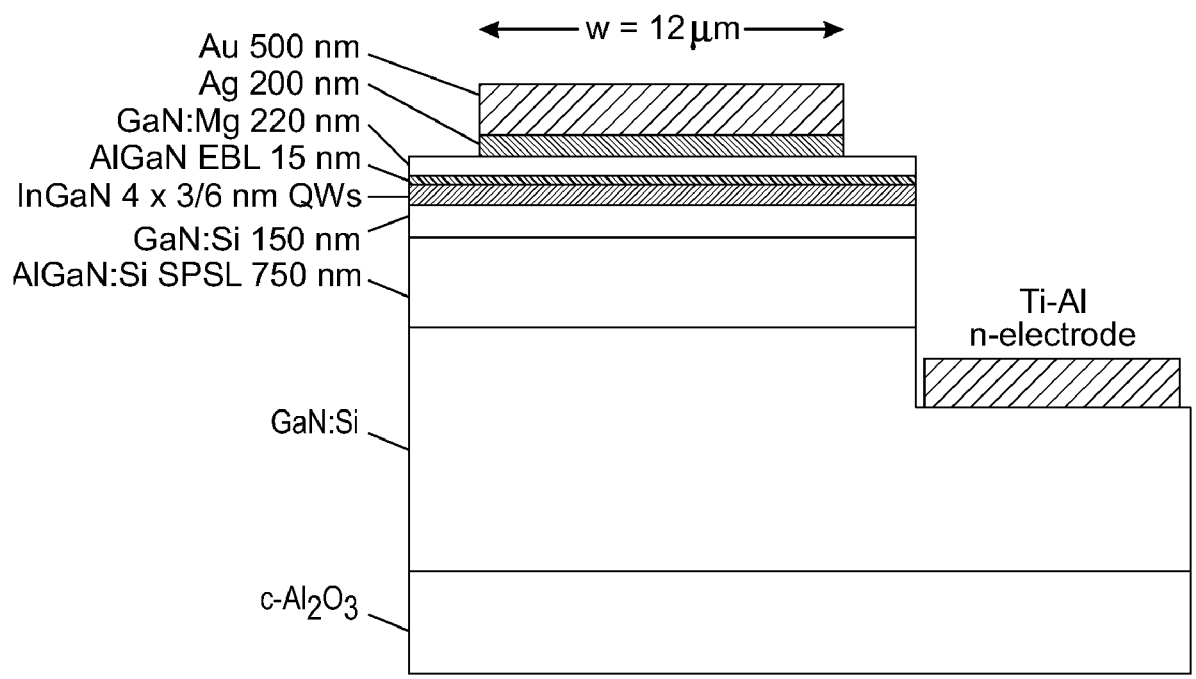
FIG. 13 is a cross-section view of an Ag-clad nitride LD structure according to an embodiment of the present invention.

As a specific example, a 412 nm 4×3 nm $In_{0.1}Ga_{0.9}N$ quantum well nitride laser diode in which the upper cladding layer is silver metal has been demonstrated. The Ag-clad nitride LD structure is shown in FIG. 13. The n-side is similar to conventional GaN-based LDs, including a 750 nm $Al_{0.14}Ga_{0.86}N/GaN$ (3/3 nm), (0001)-oriented short-period superlattice cladding layer deposited over a thick n-type GaN/sapphire template. The active region consists of 4×$In_{0.1}Ga_{0.9}N$/GaN (3/6 nm) quantum wells, embedded in a GaN separate confinement heterostructure (SCH). A p-type $Al_{0.2}Ga_{0.8}N$:Mg electron blocking layer is deposited over the last GaN barrier. The silver metal cladding is applied directly over the p-type SCH layer, replacing the p-type AlGaN cladding layer typical of conventional nitride LD structures. The thicknesses of the n- and p-type SCH layers are designed through transverse waveguide simulations, to determine the QW confinement factor (Γ) and the mode loss (α) associated with the silver metal cladding, for the fundamental TE mode.

At a wavelength of 410 nm, the complex index of silver is n=0.17+2.0i, representing a huge index discontinuity with respect to GaN. Consequently, when silver metal is applied as a waveguide cladding layer, the confined optical mode experiences a very abrupt decay in the silver.

The nitride LD heterostructure was prepared by metalorganic chemical vapor deposition (MOCVD) using trimethyl-group-III precursors, ammonia, silane and biscyclopentadienylmagnesium for n- and p-type doping, in $H_2$ and $N_2$ carrier gases. The n-type AlGaN cladding layer was deposited at a pressure of 200 Torr, while all other layers were grown at an elevated pressure of 700 Torr for best optical efficiency and p-type doping. Subsequently, mirrors and n-contact pads were formed by chemically-assisted ion-beam etching (CAIBE). The silver cladding was formed by evaporating 200 nm silver, followed by 500 nm gold. The n-contact electrode was formed with a Ti—Au metallization. Cavity lengths were 300, 400, 500, 700, 1000, and 1500 μm, with uncoated (as-etched) mirrors; and the stripe width of the simple gain-guided LDs was 12 μm. The diodes were tested under pulsed conditions at room temperature, with 100 nsec pulse width, and 1 kHz repletion rate.

Figure 14:
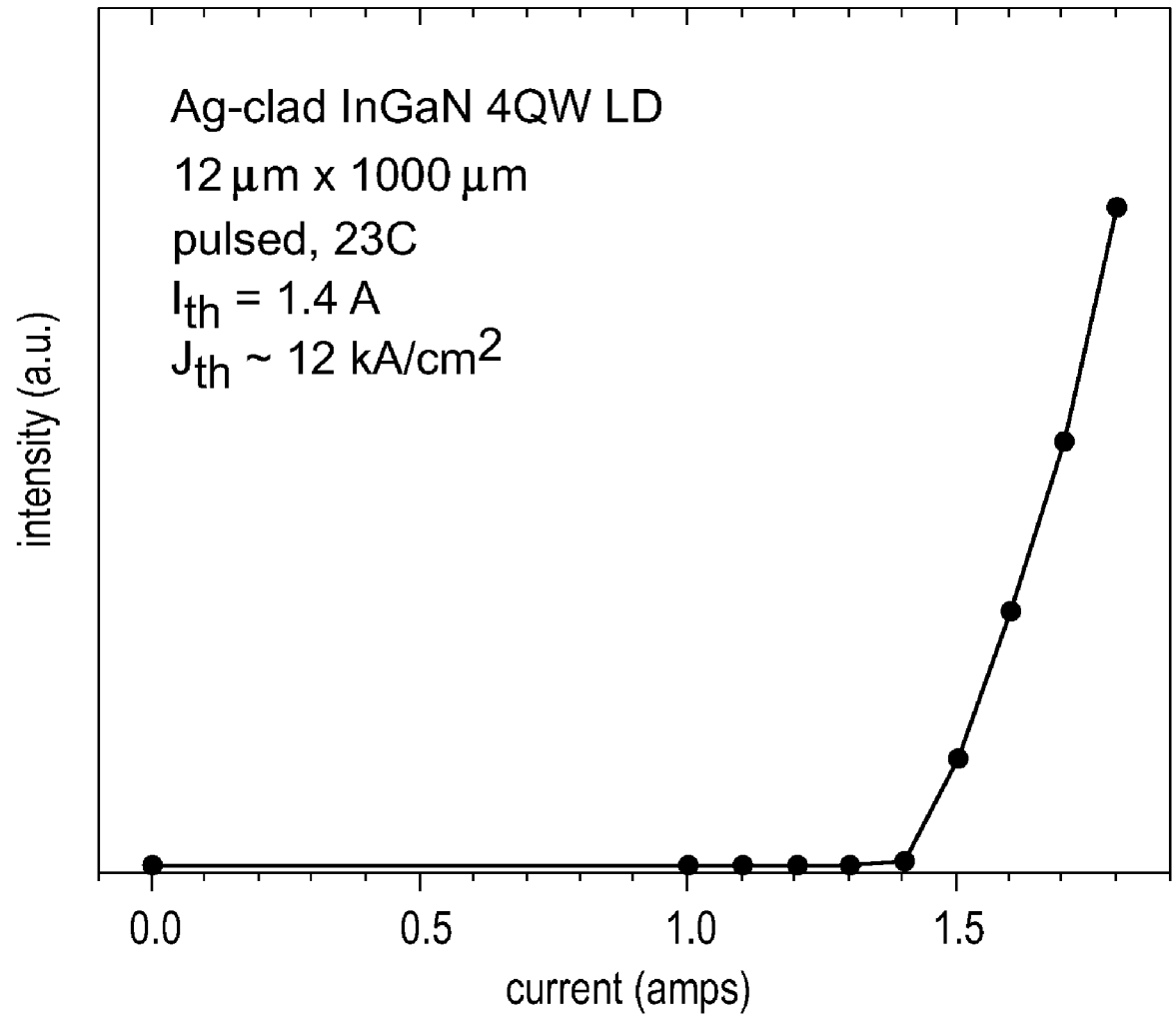
FIG. 14 is graph of the room-temperature, pulsed (100 nsec pulse, 1 kHZ repetition rate) light vs. current characteristic for a 12 μm×1000 μm silver clad nitride laser diode according to the embodiment shown in FIG. 13.
Figure 15:
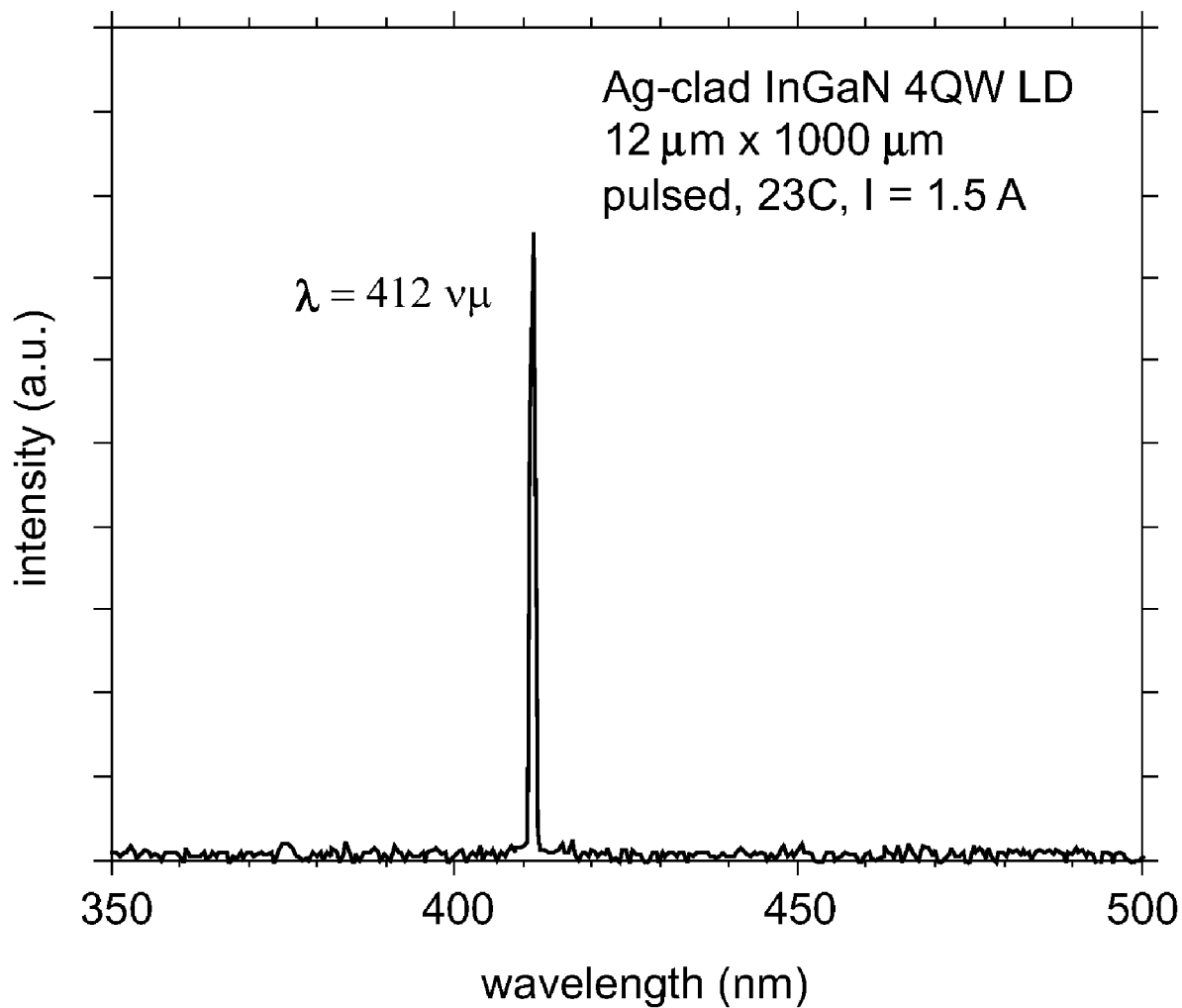
FIG. 15 is a graph showing the emission spectrum of a 12 μm×1000 μm silver clad nitride laser diode measured at pulsed current of 1.5 A according to the embodiment shown in FIG. 13.
Figure 16:
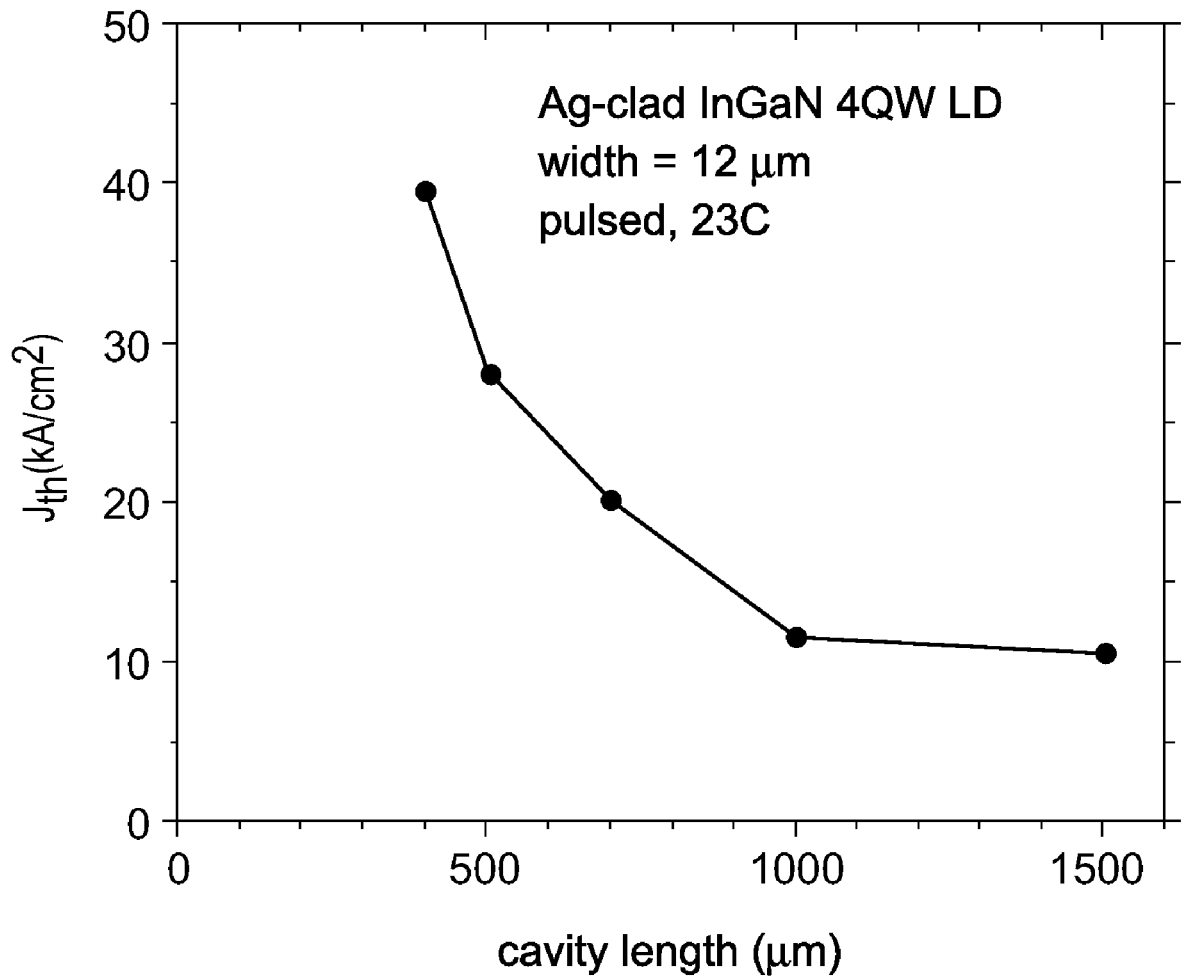
FIG. 16 is a graph of the cavity-length dependence of threshold current density ($J_{th}$) for 12 μm wide silver clad nitride laser diode, for room temperature pulsed operation, according to the embodiment shown in FIG. 13.

The pulsed light vs. current characteristic for a 12 μm×1000 μm stripe is shown in FIG. 14. The threshold current is 1.4 A, corresponding to a threshold current density of about 12 kA/cm². At threshold, a far-field pattern emerged (with interference fringes produced by reflection from the etched surfaces in front of the mirror), indicative of spatial coherence and lasing. The lasing wavelength at 1.5 A pulsed current was 412 nm, as indicated in the spectrum shown in FIG. 15. The cavity-length dependence of threshold current density ($J_{th}$) is likewise shown in FIG. 16. For long (L>1000 μm) cavities, $J_{th}$ is relatively insensitive to length, due to the dominance of the distributed loss α; while for short cavities $J_{th}$ is very high, due to the changing mirror loss combined with the sublinear gain vs. current characteristic typical of QWs. Thus, this cavity-length dependence of $J_{th}$ is roughly consistent with the estimated mode loss of about 30 cm$^{-1}$. The lowest measured $J_{th}$ was about 10 kA/cm², for a 1500 μm cavity.

The silver-clad LD heterostructure offers several advantages over conventional structures. First, the absence of a semiconducting p-AlGaN cladding layer makes the structure relatively simple, and can lower both the series resistance and thermal resistivity, and inhibit cracking. Furthermore, with only minimal material required over the active region, the InGaN QW quality may be preserved against any degradation associated with the time/temperature exposure which would otherwise occur during growth of a thick p-AlGaN cladding layer. This benefit is especially significant for high-indium content structures, due to the inherent thermal instability of InGaN.

We have found that the overall mode loss may be made acceptably small. Indeed, although the loss arising from absorption in the metal clad/contact is greater than that of a conventional nitride LD structure, the large asymmetry in the mode leads to lower loss from the mode's overlap with the p-type (Mg-doped) layers. Thereby, the overall distributed loss is within practical limits. And for long wavelength (blue-green) nitride LDs, the mode loss resulting from the silver metal may be further reduced by introduction of an ITO layer between the p-SCH and the silver.

Although the specific embodiments described in this disclosure are focused on laser diodes made in the GaN material system, the same non-epitaxial upper cladding laser structures can be readily extended to other material systems such as the GaAs and InP system. The operating wavelengths would be different for different material systems. For example, GaAs-based laser diodes would typically operate at wavelengths between 630 nm and 1000 nm, and InP-based diodes would typically operate at wavelengths between 1200 nm and 1700 nm. The preferred upper cladding material could be different for light-emitting structures made in different material systems because the refractive indices and reflectivities of materials depend on wavelength. However, the basic physics would be the same. Moreover, other light-emitting devices such as superluminescent light-emitting diodes are possible. Superluminescent diodes are similar to laser diodes in that they utilize an optical waveguide, but optical feedback is suppressed.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A semiconductor light emitting device, comprising:
   a substrate;
   a crystalline semiconductor cladding layer formed over said substrate;
   a confinement heterostructure formed over said crystalline semiconductor cladding layer;
   an active region formed within said confinement heterostructure;
   a dielectric layer, formed as a stripe over said confinement heterostructure; and
   a non-epitaxial cladding layer comprising a periodic grating of discontinuous lateral ridge waveguide elements formed over said dielectric layer, said non-epitaxial cladding layer having an electrical resistivity less than 1 ohm-cm;
   whereby, at least said crystalline semiconductor cladding layer, said confinement heterostructure, and said non-epitaxial cladding layer together form a waveguide that guides light in the plane of said cladding layers.

2. The semiconductor light emitting device of claim 1, wherein said confinement heterostructure comprises a material selected from the group consisting of: aluminum, indium, gallium.

3. The semiconductor light emitting device of claim 1, wherein said non-epitaxial cladding layer is comprised of a metal.

4. The semiconductor light emitting device of claim 3, wherein said non-epitaxial cladding layer is comprised of silver (Ag).

5. The semiconductor light emitting device of claim 1, wherein said non-epitaxial cladding layer is both an upper cladding layer and a p-contact layer for the light emitting device.

6. The semiconductor light emitting device of claim 1, wherein said non-epitaxial cladding layer is comprised of an optically transparent electrically conductive layer and a metal layer deposited above said optically transparent electrically conductive layer.

7. The semiconductor light emitting device of claim 6, wherein said optically transparent conductive layer comprises a material selected from the group consisting of: indium tin oxide (ITO) and zinc oxide (ZnO).

8. The semiconductor light emitting device of claim 1, wherein said non-epitaxial cladding layer forms an optical gain guide.

9. The semiconductor light emitting device of claim 1, whereby said active region comprises indium gallium nitride (InGaN), and said semiconductor light emitting device emits light having a wavelength in the range of 350-550 nm.

10. The semiconductor light emitting device of claim 1, wherein said semiconducting light emitting device is a semiconductor diode laser.

11. The semiconductor light emitting device of claim 1, wherein said semiconducting light emitting device is a superluminescent diode.

12. The semiconductor light emitting device of claim 1, wherein said non-epitaxial cladding layer is a composite comprising a conducting oxide and a metal.

13. The semiconductor light emitting device of claim 1, whereby said active region comprises indium gallium aluminum nitride (InGaAlN), and said semiconductor light emitting device emits light having a wavelength in the range of 350-550 nm.

14. The semiconductor light emitting device of claim 13, wherein said non-epitaxial cladding layer comprises a metal having a real component of its refractive index not exceeding 0.3 for wavelengths above 350 nm.

15. The semiconductor light emitting device of claim 1, wherein said non-epitaxial cladding layer is disposed above a semiconductor layer forming an interface, the interface having an optical reflectivity exceeding 0.5 for light propagating from said confinement heterostructure.

16. A semiconductor laser diode, comprising:
a substrate;
an gallium nitride (GaN) template layer formed over said substrate;
a lower cladding layer comprising aluminum gallium nitride (AlGaN) formed over said template;
a gallium nitride (GaN) confinement heterostructure formed over said AlGaN cladding layer;
an indium gallium nitride (InGaN) multiple quantum well heterostructure active region formed within said confinement heterostructure, said active region for emitting light having a wavelength in the range of 365-550 nm;
an aluminum gallium nitride (AlGaN) electron blocking layer formed over said active region and within said confinement heterostructure;
an upper cladding layer comprising silver (Ag) formed over said confinement heterostructure; and
an optically transparent electrically conductive layer disposed between said confinement heterostructure and said upper cladding layer.

17. The semiconductor laser diode of claim 16, wherein said upper cladding layer is also an electrical contact layer for the laser diode.

18. The semiconductor laser diode of claim 16, wherein said optically transparent electrically conductive layer comprises indium tin oxide (ITO).

19. A semiconductor laser diode, comprising:
a substrate;
an gallium nitride (GaN) template layer formed over said substrate;
a lower cladding layer comprising aluminum gallium nitride (AlGaN) formed over said template;
a gallium nitride (GaN) confinement heterostructure formed over said AlGaN cladding layer;
an indium gallium nitride (InGaN) multiple quantum well heterostructure active region formed within said confinement heterostructure, said active region for emitting light having a wavelength in the range of 365-550 nm;
an aluminum gallium nitride (AlGaN) electron blocking layer formed over said active region and within said confinement heterostructure;
an upper cladding layer comprising silver (Ag) formed as a grating comprising discontinuous lateral ridge waveguide elements selectively formed over said confinement heterostructure; and
a dielectric layer, formed as a stripe over said confinement heterostructure and below said upper cladding layer.

20. The semiconductor laser diode of claim 19, wherein said upper cladding layer form an optical gain guide.

* * * * *